(12) United States Patent
Held

(10) Patent No.: US 6,761,619 B1
(45) Date of Patent: Jul. 13, 2004

(54) METHOD AND SYSTEM FOR SPATIAL UNIFORM POLISHING

(75) Inventor: Ruediger Held, Minneapolis, MN (US)

(73) Assignee: Cypress Semiconductor Corp., San Jose, CA (US)

( * ) Notice: Subject to any disclaimer, the term of this patent is extended or adjusted under 35 U.S.C. 154(b) by 415 days.

(21) Appl. No.: 09/902,837

(22) Filed: Jul. 10, 2001

(51) Int. Cl.[7] .............................................. B24B 1/00
(52) U.S. Cl. .................... 451/41; 451/288; 438/691
(58) Field of Search ..................... 451/41, 285–289, 451/398; 438/690–693

(56) References Cited

U.S. PATENT DOCUMENTS

| | | | |
|---|---|---|---|
| 4,193,226 A | 3/1980 | Gill, Jr. et al. | |
| 4,811,522 A | 3/1989 | Gill, Jr. | |
| 5,421,769 A | 6/1995 | Schultz et al. | |
| 5,584,746 A | 12/1996 | Tanaka et al. | |
| 5,651,724 A * | 7/1997 | Kimura et al. | 451/41 |
| 5,766,058 A | 6/1998 | Lee et al. | |
| 5,934,977 A * | 8/1999 | Marmillion et al. | 451/36 |
| 5,961,375 A | 10/1999 | Nagahara et al. | |
| 6,010,964 A | 1/2000 | Glass | |
| 6,020,262 A | 2/2000 | Wise et al. | |
| 6,020,639 A | 2/2000 | Ulrich et al. | |
| 6,024,630 A * | 2/2000 | Shendon et al. | 451/41 |
| 6,091,130 A | 7/2000 | Oyamatsu et al. | |
| 6,171,513 B1 * | 1/2001 | Davis et al. | 216/88 |
| 6,203,408 B1 | 3/2001 | Quek | |
| 6,315,649 B1 * | 11/2001 | Hu et al. | 451/285 |
| 6,340,326 B1 | 1/2002 | Kistler et al. | |
| 6,344,414 B1 | 2/2002 | Davis et al. | |
| 6,361,419 B1 * | 3/2002 | Zuniga et al. | 451/287 |
| 6,368,968 B1 | 4/2002 | Hsu | |
| 6,422,927 B1 * | 7/2002 | Zuniga | 451/288 |
| 6,509,270 B1 | 1/2003 | Held | |
| 6,558,232 B1 * | 5/2003 | Kajiwara et al. | 451/41 |
| 6,627,098 B2 * | 9/2003 | Custer et al. | 216/88 |

* cited by examiner

*Primary Examiner*—Joseph J. Hail, III
*Assistant Examiner*—David B. Thomas
(74) *Attorney, Agent, or Firm*—Kevin L. Daffer; Mollie E. Lellang; Conley Rose P.C.

(57) ABSTRACT

A method is provided for processing a semiconductor topography. In an embodiment, the method includes positioning a semiconductor topography against a carrier plate with a raised section. Such a method preferably allows a larger area capable of producing a target yield of semiconductor devices within dimensional specifications to be obtained than is obtained by positioning the topography against a carrier plate with a flat surface. As such, positioning a topography against a carrier plate with one or more raised sections may form a substantially planar upper surface in a larger area than in an area formed by positioning such a topography against a flat surface carrier plate. Furthermore, such a method is preferably conducted in a single polishing step. As such, a polishing system is provided which includes a carrier plate with a raised section adapted to planarize a semiconductor topography in one polishing step.

22 Claims, 5 Drawing Sheets

METHOD AND SYSTEM FOR SPATIAL UNIFORM POLISHING

BACKGROUND OF THE INVENTION

1. Field of the Invention

This invention relates to semiconductor device manufacturing, and more particularly, to an improved method and system for polishing a semiconductor topography.

2. Description of the Related Art

The following descriptions and examples are not admitted to be prior art by virtue of their inclusion within this section.

Fabrication of an integrated circuit involves numerous processing steps. For example, isolation regions may be formed in the semiconductor substrate to separate subsequently formed active regions of the substrate. In addition, after implant regions (e.g., source/drain regions) have been placed within a semiconductor substrate and gate areas defined upon the substrate, an interlevel dielectric may be formed across the topography to isolate the gate areas and the implant regions from overlying conductors. Interconnect routing may then placed over the interlevel dielectric and connected to the implant regions and/or the gate areas by ohmic contacts formed through the interlevel dielectric. Alternating levels of interlevel dielectric and interconnect may be placed across the semiconductor topography to form a multi-level integrated circuit.

Forming substantially planar upper surfaces of a semiconductor topography during intermediate process steps may facilitate fabrication of layers and structures that meet design specifications. For example, a dielectric layer may be formed across a previously patterned layer of a semiconductor topography using a process such as chemical vapor deposition ("CVD"). Such a dielectric layer may be used to form an interlevel dielectric or shallow trench isolation regions. Elevational disparities of the deposited dielectric layer may be reduced by polishing the deposited dielectric layer using a process such as chemical mechanical polishing ("CMP"). In an embodiment in which the dielectric layer is an interlevel dielectric, a contact opening may be formed within the polished dielectric layer and subsequently filled with a layer of conductive material. In this manner, the layer of conductive material may be formed within the contact opening and on an upper surface of the polished dielectric layer. As such, the layer of conductive material may also be polished such that an upper surface of the contact structure may be relatively level with an upper surface of the dielectric layer.

Additional layers and structures may be formed upon such layers and structures. The additional layers and structures may include, for example, additional dielectric layers, additional contact structures, local interconnect wires, and/or metallization layers. In this manner, the polished upper surface of the dielectric layer and/or structures may facilitate the formation of such additional layers and structures having uniform vertical and lateral dimensions. For example, the polishing of the semiconductor topography may facilitate the formation of local interconnect structures having a substantially uniform thickness by providing a relatively planar surface upon which a dielectric material may be deposited to insulate adjacent local interconnect structures.

Moreover, the polishing of the semiconductor topography may aid in forming local interconnect structures having uniform lateral dimensions by providing a level surface upon which a patterned masking layer may be formed. In this manner, a masking layer may be accurately patterned by a lithography technique such that the pattern may be accurately transferred to a dielectric layer to form local interconnect structures. In another embodiment, the polishing of the semiconductor topography may include forming shallow trench isolation regions with substantially planar surfaces such that the aforementioned additional layers and structures may be formed with uniform thickness and with lateral dimensions within specification. Accordingly, layers and structures of a semiconductor device may be formed having dimensions which are approximately equal to the design specifications of the semiconductor device.

Forming a substantially planar upper surface of such layers and structures may play an important role in the functionality of a semiconductor device. For example, problems with step coverage may arise when a dielectric, conductive, or semiconductive material is deposited over a topological surface having elevationally raised and raised regions. Step coverage is defined as a measure of how well a film conforms over an underlying step and is expressed by the ratio of the minimum thickness of a film as it crosses a step to the nominal thickness of the film over horizontal regions. Furthermore, substantially planar surfaces may become increasingly important as the feature sizes of semiconductor devices are reduced, since the depth of focus required to pattern an upper surface of a semiconductor topography may increase with reductions in feature size. In addition, if a topography is non-planar, the patterned image may be distorted and the intended structure may not be formed to the specifications of the device. In particular, correctly patterning layers upon a topological surface containing elevational "hill" or "valley" areas may be difficult using optical lithography since the all parts of the topography must be within the depth of focus of the lithography system.

As mentioned above, CMP is a technique commonly employed to polish or remove the elevational fluctuations in the surface of a semiconductor topography. A conventional CMP process may involve placing a semiconductor wafer against a backing plate of a wafer carrier in order to hold the wafer relative to an underlying polishing pad. The wafer may then be pressed face-down toward the polishing pad which lies on or is attached to a support structure. During the CMP process, the polishing pad and/or the wafer carrier may be set in motion as the wafer is forced against the pad. For example, the polishing pad and the wafer carrier may be placed on a rotatable table such that the wafer and the polishing pad may be rotated relative to each other. Alternatively, the wafer carrier may be rotated relative to a fixed pad or vice versa. In another embodiment, the polishing pad may be a belt, which traverses against a fixed or rotating wafer. In either embodiment, the rotatable table, fixed pad, or belt may serve as the support structure to which the polishing pad lies upon or is attached.

An abrasive, fluid-based chemical suspension, often referred to as a "slurry," may be deposited onto the surface of the polishing pad. The slurry fills the space between the polishing pad and the wafer surface such that a chemical in the slurry may react with the surface material being polished. The movement of the polishing pad relative to the wafer causes abrasive particles entrained within the slurry to physically strip the reacted surface material from the wafer. In addition, the pad itself may physically remove some material from the surface of the semiconductor topography. Therefore, the process may employ a combination of chemical stripping and mechanical polishing to form a relatively level surface.

Unfortunately, a CMP process may not form a substantially planar surface across an entire semiconductor topography. In particular, the polishing rate of CMP may vary across a topography such that a semiconductor topography polished by a CMP process may have substantial elevational disparities. Such disparities may be particularly prevalent at an edge of the topography. For instance, a thickness of a semiconductor topography subsequent to chemical mechanical polishing may be greater at the edge of the topography than at an inner portion of the topography. The greater thickness of the semiconductor topography at its edge may be due to a slow polish rate at the edge of the topography as compared to polish rates at other regions of the topography. Several factors may influence the polish rates of a CMP process. For example, the polish rates may depend on the surface materials being polished or the rotational and lateral movement of the polishing pad relative to the semiconductor topography. Additional factors, which may affect polish rates of the CMP process, may include elements such as the polishing tool, the pad materials, the slurry, and interactions between these elements.

Some CMP tool manufacturers currently specify that their equipment is capable of forming a substantially planar surface across an area of a topography including the center of the topography and extending to a boundary 6 mm from the outer edge of the topography. However, such capabilities are difficult to obtain in practice with conventional CMP tools since the polishing process is so greatly dependent upon the condition of the incoming material. Practical and consistent capabilities of conventional CMP tools tend to result in a substantially planar surface in a region including the center of the topography and extending to a boundary at about 8 mm from the outer edge of the topography.

Elevational disparities which may be present on a semiconductor topography subsequent to chemical mechanical polishing may inhibit the formation of functional semiconductor devices on a portion of the semiconductor topography. For example, since the thickness of the semiconductor topography may be greater at an outer edge of the semiconductor topography than at an inner portion of the semiconductor topography, the thickness of the semiconductor topography at the outer edge may be outside the design specifications for a semiconductor device. Consequently, semiconductor devices formed at the outer edge of such a semiconductor topography may have dimensions which deviate significantly from design specifications. In this manner, acceptable devices may not be formed on an area of the semiconductor topography having such elevational disparities, thereby reducing the number of devices which may be formed on the semiconductor topography. As such, the presence of such elevational disparities on a semiconductor topography may reduce manufacturing yield and may increase production costs per semiconductor device.

Accordingly, it would be advantageous to develop a method and a system for increasing the amount of area across a semiconductor topography which is suitable for fabricating devices, including in a region near its outer edge.

SUMMARY OF THE INVENTION

The problems outlined above may be in large part addressed by a method and a system adapted for polishing a semiconductor topography. In particular, a method is provided which includes positioning a semiconductor topography against a carrier plate with a raised section. Such a method preferably allows a larger area capable of producing a target yield of semiconductor devices within dimensional specifications to be obtained than is obtained by positioning the topography against a carrier plate with a flat surface. The area producing such a target yield may be referred to as the area of the topography from which semiconductor devices may be suitably fabricated. More specifically, such an area preferably includes a substantially planar surface over which dimensional design specifications of subsequently formed devices may be met. As such, positioning a topography against a carrier plate with a raised section may form a substantially planar upper surface in a larger area than an area formed by positioning such a topography against a flat surface carrier plate. Furthermore, such a method is preferably conducted in a single polishing step. As such, a polishing system is provided which includes a carrier plate with a raised section adapted to planarize a semiconductor topography in a single polishing step.

In an embodiment, a polishing system may include a carrier plate with a raised section. Such a system may be adapted to planarize a semiconductor topography in a single polishing step. The use of the carrier plate with the raised section preferably allows a substantially planar surface to form across the topography in one polishing step. In some embodiments, the carrier plate may include multiple raised sections with which to form substantially planar surface in the single polishing step. The substantially planar surface may extend across a portion of the topography including the center of the topography to a boundary less than approximately 4 mm from the outer edge of the topography. In some embodiments, the boundary may be approximately 2 mm or less from the outer edge of the topography.

In addition, the dimensions of the raised section may be optimized such that a substantially planar upper surface of the semiconductor topography may be obtained in a single polishing step. For example, the raised section may be between approximately 0.0002 inches and approximately 0.005 inches thick. Moreover, the thickness variation of the raised section may be less than or equal to approximately 0.0005 inches. Alternatively, the thickness variation of the raised section may be more than approximately 0.0005 inches. In such an embodiment, the thickness of the raised section may vary continuously. In an alternative embodiment, the thickness of the raised section may vary such that steps of different thicknesses are formed. Furthermore, the cross-sectional lateral dimension of the raised section may be between approximately 1 mm and approximately 10 mm. More specifically, the cross-sectional lateral dimension of the raised section may be between approximately 2 mm and approximately 4 mm.

In conjunction with the aforementioned system, the method as described herein may include positioning the topography against a carrier plate with a raised section such that a larger area capable of producing a target yield of semiconductor devices within dimensional specifications may be obtained than is obtained by positioning the topography against a carrier plate with a flat surface. Such a target yield may be, for example, greater than 85%. In some embodiments, the target yield may be greater than 95%. In a preferred embodiment, the polishing process may include forming a substantially planar surface across the larger area in a single polishing step. The larger area may, for example, be a region of the semiconductor topography including the center of the topography and extending to a boundary less than approximately 4 mm from the outer edge of the topography. In some cases, the boundary may be approximately 2 mm or less from the outer edge of the topography.

In some embodiments, the polishing rate of the topography at the boundary of the subsequently formed larger area may be greater than or equal to the polishing rate of the center of the topography. More specifically, the polishing rate of the topography at the boundary of the subsequently formed larger area may be greater than the polishing rate of the center of the topography. In addition or alternatively, the polishing rate differential across the portion of the topography polished to form the larger area may less than approximately 10%. In another embodiment, the polishing rate differential across the portion of the topography polished to form the larger area may be less than approximately 5%. As such, the method as described herein may form a substantially planar surface across the larger area. For example, in an embodiment in which the polished topography includes a plurality of structures, the thickness of a structure arranged at the boundary of the larger area may differ by less than approximately 10% from a thickness of a corresponding structure arranged within the center of the topography.

As stated above, the method may include planarizing the topography in a single step. In such an embodiment, the planarizing step may include positioning the topography against a carrier plate which includes a raised section. In particular, the planarizing process may include positioning the topography against the surface of the carrier plate that includes the raised section. In an embodiment, the raised section may include a lip arranged at the edge of the carrier plate. The planarizing process may further include forming a substantially planar surface in a region of the topography including the center of the topography to a boundary less than approximately 4 mm from the outer edge of the topography. In some embodiments, such a region may extend to a boundary approximately 2 mm or less from the outer edge of the topography. In a preferred embodiment, the amount of the semiconductor topography removed during the planarizing process may vary by less than approximately 10% across the portion of the topography planarized to form the aforementioned region. In some embodiments, the amount of the semiconductor topography removed during the planarizing process may vary by less than approximately 5% across the portion of the topography planarized to form such a region.

There may be several advantages to forming a substantially planar upper surface upon a semiconductor topography. For example, a functional semiconductor device may be formed in a region extending less than approximately 8 mm from the outer edge of a semiconductor substrate. In some cases, the method as described herein may allow semiconductor devices to be formed in a region of the topography extending less than approximately 6 mm from the outer edge of the topography. The formation of functional semiconductor devices within such a relatively close vicinity of the outer edge of the substrate may allow for an increase in the number of devices that may be formed upon a substrate. Such an increase in semiconductor device formation upon a substrate may increase manufacturing yield and may reduce production costs per semiconductor device.

BRIEF DESCRIPTION OF THE DRAWINGS

Other objects and advantages of the invention will become apparent upon reading the following detailed description and upon reference to the accompanying drawings in which:

FIG. 1b depicts a partial cross-sectional view of the raised section of the carrier plate within the chemical-mechanical polishing system of FIG. 1a;

FIG. 2 depicts a top view of the carrier plate used in the chemical-mechanical polishing system of FIG. 1a;

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Generally, a CMP process may involve placing a semiconductor topography against a carrier plate of a wafer carrier in order to hold the wafer relative to an underlying polishing pad. The carrier plate generally has a flat surface with which to receive the wafer. The wafer carrier may then be pressed down toward the polishing pad such that the semiconductor topography faces the polishing pad. The polishing pad may be made of various substances, depending on the material being polished. For example, a popular polishing pad medium includes polyurethane or polyurethane-impregnated polyester felts. During the typical CMP process, the polishing pad and/or the semiconductor topography may be set in motion while the semiconductor topography is forced against the polishing pad. For example, the polishing pad and the wafer may be placed on a rotatable table such that the wafer carrier and the polishing pad may be rotated relative to each other. Alternatively, the wafer carrier may be rotated relative to a fixed pad or vice versa. In another embodiment, the polishing pad may be a belt, which traverses against a fixed or rotating wafer. In either embodiment, the rotatable table, fixed pad, or belt may serve as the backing structure to which the polishing pad lies upon or is fixedly attached.

An abrasive, fluid-based chemical, often referred to as a "slurry", may be deposited upon the surface of the polishing pad. The slurry may occupy an interface between the polishing pad and the surface of the semiconductor topography. As such, elevationally extending features of the semiconductor topography may be positioned such that they may contact the chemical slurry. The slurry may initiate the polishing process by chemically reacting with the surface material being polished. The movement of the polishing pad relative to the semiconductor topography may cause abrasive particles entrained within the slurry to physically strip the reacted surface material from the semiconductor topography. Such abrasive slurry particles may include, for example, silica, alumina, or ceria. Alternatively, a polishing solution substantially absent of abrasive particles may be used with an abrasive polish surface. Some factors that may influence the effect of any polishing solution used include the pH of the solution, the flow dynamics at the pad and semiconductor topography interface, and the etch selectivity of the solution with respect to materials within the semiconductor topography. A post-CMP cleaning step may be required to remove residual slurry particles from the surface of the polished topography.

Figure 1A:
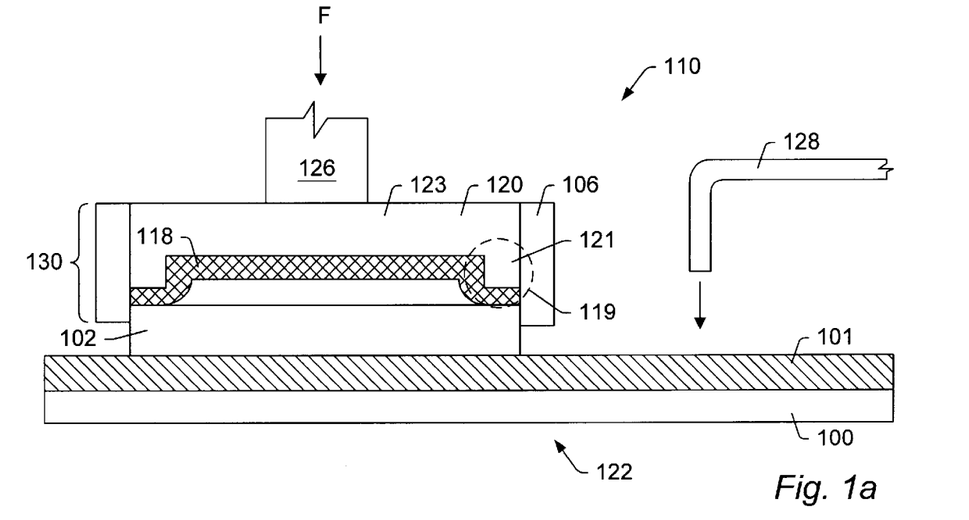
FIG. 1a depicts a partial cross-sectional view of a semiconductor topography pressed against a polishing pad in a chemical-mechanical polishing system, wherein the chemical-mechanical polishing system includes a carrier plate with a raised section.

Turning to the drawings, an exemplary embodiment of a CMP system for processing a semiconductor topography according to the method as described herein is illustrated in FIG. 1a. In particular, CMP system 110 is shown which is adapted to planarize semiconductor topography 102 in a single polishing step. More specifically, CMP system 110 includes a carrier plate with a raised section with which to form a larger area capable of producing a target yield of semiconductor devices within dimensional specifications than is formed by a system including a carrier plate with a flat surface. This is distinctly different from conventional methods and systems for polishing a semiconductor topography. Such methods and systems generally do not produce a substantially planar surface in a single polishing step. In an alternative embodiment polishing system 110 may include any system with which to polish a surface. Such a system is not restricted to use in the semiconductor fabrication industry.

Planarizing, as described herein (and sometimes also referred to herein as polishing), may refer to forming a substantially planar surface in an area of the topography from which functional semiconductor devices may be suitably fabricated. In other words, planarizing preferably forms an area that includes a substantially planar surface from which dimensional design specifications of subsequently formed devices may be met. Such an area may include the center of the topography and extend to a boundary less than approximately 4 mm from the outer edge of the topography. In some embodiments, such a boundary may be approximately 2 mm or less from the outer edge of the topography. In a preferred embodiment, the boundary may run in alignment with the entire outer edge of the topography. In this manner, the area may be centered upon the semiconductor topography.

The ability of CMP system 110 to planarize a semiconductor topography in a single polishing step may attributed to the inclusion of carrier plate 120 with raised section 121. More specifically, the use of a carrier plate with a raised section may compensate for the upper layer non-uniformity that is usually formed with conventional polishing processes. In particular, the inclusion of such a carrier plate may compensate for the upper layer non-uniformity in a region adjacent to the outer edge of the topography. In this manner, a substantially planar surface may be obtained across the topography including the center and extending to a region adjacent to the outer edge of the topography. Consequently, a larger area that is capable of producing a target yield of semiconductor devices within dimensional specifications of the semiconductor topography may be formed with a system that has a carrier plate with a raised section than with a system that has a carrier plate with a flat surface.

FIG. 1a depicts a CMP system that includes wafer carrier 130 adapted to hold semiconductor topography 102. Wafer carrier 130 may include carrier backing film 118, carrier plate 120, and carrier ring 106. In particular, backing film 118 may be attached to carrier plate 120 in a manner with which to receive the backside of semiconductor topography 102. More specifically, semiconductor topography 102 may be placed in wafer carrier 130 such that backing film 118 contacts at least a portion of the backside of semiconductor topography 102. In addition, carrier ring 106 is preferably configured to hold semiconductor topography 102 in alignment with backing film 118. Subsequently, semiconductor topography 102 may be pressed against polishing pad 101 to polish the topography. Upon pressing semiconductor topography 102 against polishing pad 101, backing film layer 118 may be compressed such that additional portions of backing film layer 118 may come in contact with semiconductor topography 102 (not shown). For example, backing film 118 may be compressed enough to contact a portion of semiconductor topography 102 adjacent to the raised region of carrier plate 120.

Semiconductor topography 102 may be a semiconductor substrate with a substantially planar surface prior to polishing with CMP system 110. Alternatively, semiconductor topography 102 may include one or more layers, such as dielectric or metallization layers, formed upon a semiconductor substrate. Another embodiment may include one or more structures, such as gate structures, contact structures, and local interconnect wires, formed upon or within semiconductor substrate 102. And yet another embodiment may include diffusion regions and/or isolation regions formed upon or within semiconductor substrate 102. In some cases, one or more layers, structures, and/or regions may be combined to form semiconductor topography 102. The layers and structures may form a substantially planar or non-planar upper surface. The upper surface (the side of semiconductor topography 102 facing downward for polishing in FIG. 1a) may be polished by the system as described herein in an effort to form a substantially planar upper surface, reduce the thickness of an upper layer of the topography, and/or remove surface irregularities of semiconductor topography 102.

Backing film 118 may include a variety of materials as recognized by one skilled in the art of semiconductor fabrication. In particular, backing film 118 may comprise materials that are typically interposed between a carrier plate and the backside of a semiconductor topography during the utilization of wafer carriers and/or CMP systems. In one embodiment, backing film 118 may comprise a similar material to that of Carrier Film DF 200, commercially available by Rodel of Newark, Del. In addition, the thickness of backing film 118 may be substantially similar to the thickness of the backing films known to those skilled in the art. For example, backing film layer 118 may have a thickness between approximately 0.1 mm and approximately 3.0 mm. However, the thickness of the backing film layer may be smaller or larger depending on the design specifications of the polishing process. In a preferred embodiment, backing film layer may be less than approximately 1.0 mm to insure the thickness of the backing film layer does not impede the functionality of the raised section of the carrier plate.

As stated above, the configuration of carrier plate 120 may allow backing film 118 to contact at least a portion of the backside of semiconductor topography 102 upon positioning semiconductor topography 102 in wafer carrier 130. As such, backing film 118 may include a continuous layer conformably formed across and upon the side of carrier plate 120 including raised section 121. Alternatively, backing film 118 may include two segments. One segment may be arranged upon raised section 121, while another segment may be arranged upon the portion of the carrier plate adjacent to the raised section. In this manner, the two segments of the backing film may be separated by the vertical walls of raised section 121.

In addition to wafer carrier 130 and semiconductor topography 102, CMP system 110 may include backing structure 100, polishing pad 101, shaft 126, and conduit 128. The CMP process may involve placing semiconductor topography 102 against backing film 118 and thus against carrier plate 120 in order to hold the topography relative to polishing pad 101. Downward force F may then be applied to shaft 126, which is attached to the backside of wafer carrier 130 to press semiconductor topography 102 against polishing pad 101, which lies on or is attached to backing structure 100. Backing structure 100 may include a rotatable table or platen, a fixed pad, or a belt. Wafer carrier 130 may hold semiconductor topography 102 on polishing pad 101 as the pad and the topography are moved relative to each other. A "slurry" consisting of an abrasive and a fluid-based chemical may be deposited from conduit 128 positioned above polishing pad 101 onto the upper surface of the pad. The slurry may fill the space between pad 101 and the surface of semiconductor topography 102. The movement of polishing pad 101 relative to semiconductor topography 102 causes abrasive particles entrained within the slurry to physically strip the reacted surface material from semiconductor topography 102. In an alternative embodiment, the slurry may be substantially free of abrasive particles. In either embodiment, the pad itself may also physically remove some material from the topological surface of the semiconductor topography 102.

As shown in FIG. 1a, carrier plate 120 may include raised section 121. Raised section 121 may be a raised portion of carrier plate 120 relative to base section 123 of the carrier plate. As shown in FIG. 1a, raised section 121 may be a lip arranged at the edge of the carrier plate. Positioning semiconductor topography 102 against a carrier plate with a raised section along the edge of the carrier plate may allow the CMP system to form a larger area capable of producing a target yield of semiconductor devices within dimensional specifications of the semiconductor topography than is formed by positioning the topography against a carrier plate with a flat surface. In other embodiments, however, raised section 121 may not necessarily be positioned along the outer edge of carrier plate 120. In contrast, raised section 121 may be arranged relative to any region of carrier plate 120. Regardless of the location of raised section 121, semiconductor topography 102 is preferably positioned against the side of carrier plate 120 with raised section 121. In other words, carrier plate 120 may be positioned such that raised section 121 is facing polishing pad 101. In addition, carrier plate 120 may include multiple raised sections with which to form a substantially planar upper surface of semiconductor topography 102.

Figure 1B:
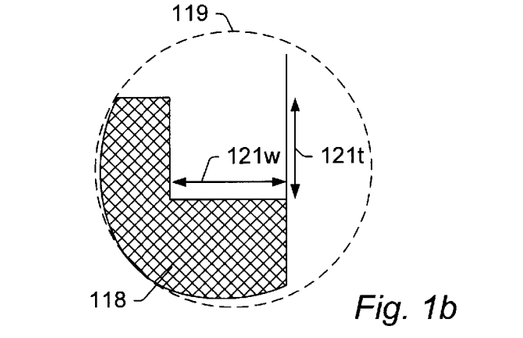

The dimensions of raised section 121 may influence the planarity of the polished topography. For example, the width and thickness of raised section 121 may affect the thickness variation of an upper layer across the region of the polished topography that is capable of producing a target yield of semiconductor devices within dimensional specifications of the semiconductor topography. In some embodiments, the width and thickness of raised section 121 may be substantially constant. Alternatively, the width and/or thickness of raised section 121 may vary depending on the design specifications of the wafer fabrication process. Portion 119 of CMP system 110 is magnified to illustrate width 121w and thickness 121t of raised section 121 as shown in FIG. 1b. It is noted that portion 119 of FIGS. 1a and 1b is not drawn to scale. In particular, thickness 121t in relation to width 121w is greatly exaggerated to emphasize the dimensions of raised section 121. In general, the cross-sectional lateral dimension of raised section 121 (121w) may be between approximately 1 mm and approximately 10 mm. In contrast, the thickness dimension of raised section 121 (121t) may be on the order of a few microns to few hundred microns.

Figure 2:
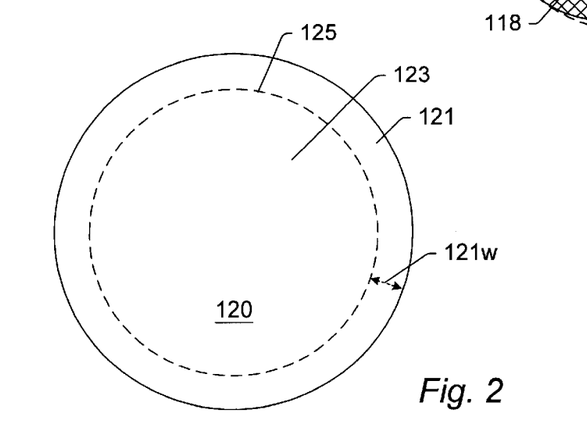

Width 121w may be referred to as the cross-sectional lateral dimension of raised section 121 arranged in parallel to polishing pad 101 in FIG. 1a. Thickness 121t may be referred to as the distance between the upper surface of base section 123 of carrier plate 120 and the upper surface of raised section 121. The upper surface of base section 123 may be the surface of the base portion facing downward and in contact with backing film 118 as shown in FIG. 1a. Likewise, the upper surface of raised section 121 may be the side of raised section 121 facing downward and in contact with backing film 118 as shown in FIGS. 1a and 1b. In an embodiment in which raised section 121 is arranged along the periphery of carrier plate 120, the top view (the side of the carrier plate facing downward and in contact with backing film 118) of carrier plate 120 may look substantially similar to FIG. 2. In particular, raised section 121 may extend from the outer edge of carrier plate 120, while base section 123 may include a center of the plate. Dotted line 125 depicts the interface between raised section 121 and base section 123. Other configurations of carrier plate 120, however, may be used depending on the design characteristics of the wafer fabrication process.

The dimensions of raised section 121 may be optimized such that a substantially planar surface across a larger area of the topography may be formed subsequent to polishing than may be formed with a CMP process which includes a flat surface carrier plate. In one embodiment, the configurations of width 121w and thickness 121t may be based upon the elevational disparities of a topography polished by a conventional polishing process, i.e., a process including a flat surface carrier plate. For example, width $121w$ may be approximately equal to the width of a substantially non-uniform region of a topography polished by the conventional polishing process. Such a non-uniform region may include an upper layer or feature that is substantially thicker than the upper layer or similar features arranged within the rest of the topography. In one embodiment, such a region may extend from the outer edge of the topography. In addition, thickness $121t$ may be approximately equal to the average excess thickness of the substantially non-uniform region as compared to that of the rest of the topography. As such, the dimensions of raised section 121 may depend on the polishing characteristics of the material to be polished.

Generally, width $121w$ and thickness $121t$ may vary according to the design specifications of the wafer fabrication process. For example, width $121w$ may be between approximately 1 mm and approximately 10 mm. In some embodiments, width $121w$ may be between approximately 2 mm and approximately 4 mm. Larger or smaller widths of raised section 121, however, may be appropriate depending on the design specifications of the wafer fabrication process. Furthermore, thickness $121t$ may be, for example, between approximately 0.0002 inches and approximately 0.005 inches or between approximately 5 microns and approximately 130 microns. In one embodiment, thickness $121t$ may be approximately 0.002 inches or approximately 50 microns. In some embodiments, the width $121w$ and thickness $121t$ may be substantially constant. Alternatively, the width $121w$ and/or thickness $121t$ may vary. For example, thickness $121t$ may vary by more than approximately 0.0005 inches. In such an embodiment, thickness $121t$ may vary continuously. Alternatively, thickness $121t$ may vary such that steps of different thicknesses are formed.

The thickness variation across raised section 121 may also be an important dimensional attribute of carrier plate 120. For example, the thickness variation of the raised section may be less than or equal to approximately 0.0005 inches or 13 microns. More specifically, thickness variation across raised section 121 may be between approximately 0.00005 inches and approximately 0.0005 inches or between approximately 1 microns and approximately 13 microns. More specifically, the thickness variation across raised section 121 may be approximately 0.0001 inches or approximately 2.5 microns. Larger or smaller thickness variations, however, may be appropriate depending on the design specifications of the wafer fabrication process. The relation between thickness $121t$ and the thickness variation across raised section 121 may also be design characteristic of raised section 121. In particular, the thickness variation across raised section 121 may be between approximately 1% to approximately 20% of thickness $121t$. However, such a percentage may be larger or smaller depending on the design specifications of the wafer fabrication process.

Figure 3:
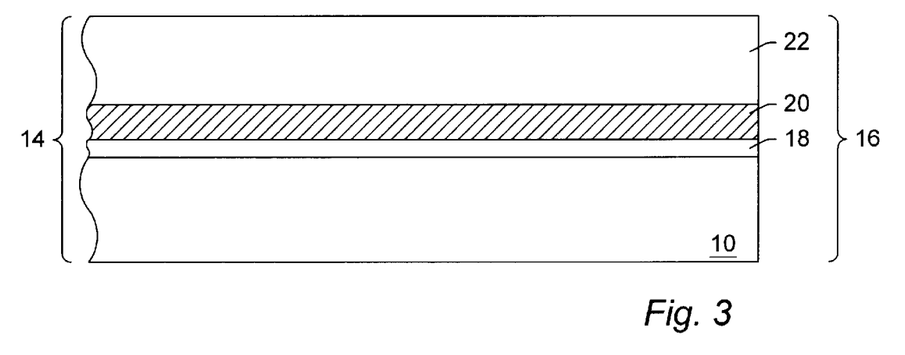
FIG. 3 depicts a partial cross-sectional view of a semiconductor topography in which an oxide layer, a polish stop layer, and a resist are formed upon a semiconductor layer.

An exemplary embodiment of the method for processing a semiconductor topography using such the system as described herein is shown in FIGS. 3–8. More specifically, FIG. 3 depicts a semiconductor topography in which oxide layer 18 may be formed upon and in contact with semiconductor layer 10. Moreover, polish stop layer 20 may be formed upon and in contact with oxide layer 18, and resist 22 may be formed upon and in contact with polish stop layer 20. As illustrated in FIG. 3, lateral surface 14 of the semiconductor topography is drawn to indicate the continuation of the semiconductor topography toward a center portion of the semiconductor topography. On the contrary, lateral surface 16 of the semiconductor topography is drawn to indicate the outer edge of the semiconductor topography.

Semiconductor layer 10 may be a silicon substrate, and may in some embodiments be doped either n-type (for producing a p-channel transistor) or p-type (for an n-channel transistor). More specifically, semiconductor layer 10 may be an epitaxial silicon layer grown on a monocrystalline silicon substrate, or an n-type or p-type well region formed in a monocrystalline silicon substrate. Alternatively, semiconductor layer 10 may include structures and layers formed upon a semiconductor substrate, such as a monocrystalline silicon semiconductor substrate. The structures and layers may include, but are not limited to, gate dielectric layers, gate structures, contact structures, local interconnect wires, additional dielectric layers, or metallization layers. In this manner, semiconductor layer 10 may be substantially planar or may have substantial elevational differences due to the formation of such structures and layers. Diffusion regions (not shown) may also be formed in semiconductor layer 10. For example, diffusion regions may be lightly doped drain regions and heavily doped source/drain regions formed in a semiconductor layer adjacent to gate structures. Furthermore, the semiconductor topography may include shallow trench isolation regions formed within a semiconductor substrate or within a layer formed upon a substrate.

Oxide layer 18 may aid in the adhesion of polish stop layer 20 to semiconductor layer 10. For example, the inclusion of an oxide layer may promote adhesion of a silicon nitride layer, which may serve as polish stop layer 20, upon a silicon layer, which may serve as semiconductor layer 10. In another embodiment, oxide layer 18 may also serve as a "pad oxide" to reduce inherent stresses between a nitride polish stop layer and a silicon substrate. Oxide layer 18 may be grown upon semiconductor layer 10 using wet or dry thermal oxidation of a silicon substrate. Alternatively, oxide layer 18 may be deposited on semiconductor layer 10 using chemical-vapor deposition ("CVD") from, for example, a gas which may include $SiH_4$ and $O_2$. Oxide layer 18 may have a thickness of, for example, from approximately 50 angstroms to approximately 250 angstroms, preferably approximately 70 angstroms to approximately 150 angstroms, and in one embodiment, approximately 100 angstroms. Oxide layer 18 may include a dielectric layer, such as silicon dioxide ($SiO_2$), tetraorthosilicate glass (TEOS), or silicon dioxide/silicon nitride/silicon dioxide (ONO). Alternatively, polish stop layer 20 may be formed upon semiconductor layer 10 without oxide layer 18.

Polish stop layer 20 may serve to protect portions of underlying layers and structures within semiconductor layer 10. For example, polish stop layer 20 may protect portions of oxide layer 18 and semiconductor 10 from an etch process which may be used to form trenches within semiconductor layer 10. Polish stop layer 20 may also serve as a stop layer for polishing processes as described herein. In this manner, the polishing of overlying layers may be substantially terminated upon exposing polish stop layer 20. Consequently, structures or layers formed upon semiconductor layer 10 adjacent to polish stop layer 20 may also be polished to approximately the same elevation level as polish stop layer 20. Alternatively, structures or layers formed upon semiconductor layer 10 adjacent to polish stop layer 20 may also be recessed to an elevational level below polish stop layer 20. Polish stop layer 20 may include silicon nitride deposited by thermally decomposing silane and ammonium in a chemical vapor deposition process maintained at a temperature in the range of approximately 200° C. to approximately 800° C. Appropriate materials for polish stop layer 20, however, may also include any material having a substantially different polish response than upper layer 12. Polish stop layer 20 may have, for example, a thickness from approximately 500 angstroms to approximately 2,000 angstroms and preferably approximately 1,200 angstroms to approximately 1,700 angstroms.

Figure 4:
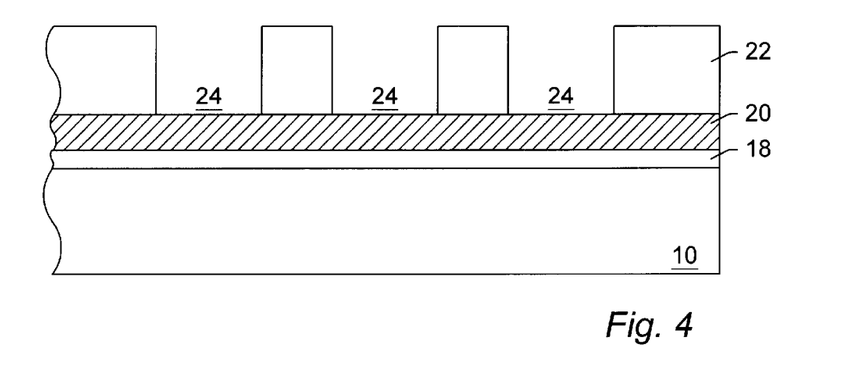
FIG. 4 depicts a partial cross-sectional view of a semiconductor topography in which the resist is patterned subsequent to the resist formation of FIG. 3.
Figure 5:
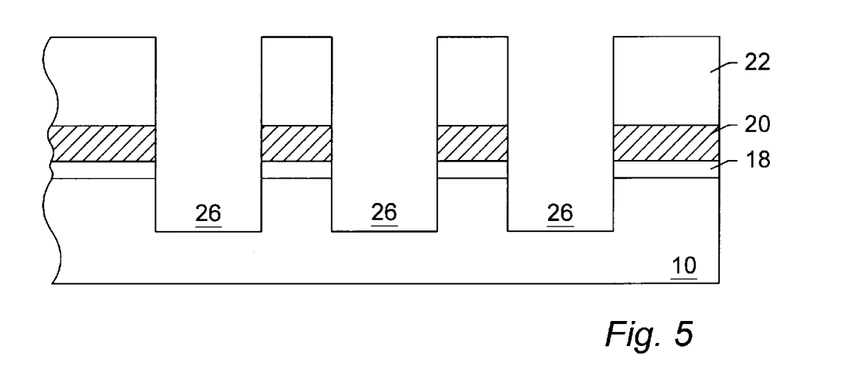
FIG. 5 depicts a partial cross-sectional view of a semiconductor topography in which trenches are formed within the semiconductor layer subsequent to the patterning of FIG. 4.

In an embodiment, resist 22 may be formed upon polish stop layer 20. Resist 22 may include a photoresist, such as a deep ultraviolet resist, an I-line resist, a G-line resist, or another resist, such as an e-beam resist or an x-ray resist. Resist 22 may be patterned using a lithography technique, thus exposing portions 24 of polish stop layer 20 as shown in FIG. 4. Exposed portions 24 of polish stop layer 20 and underlying portions of oxide layer 18 and semiconductor layer 10 may be etched to form trenches 26 as shown in FIG. 5. The etch process may include wet etch and/or dry etch techniques. The patterned photoresist may then be removed by a stripping process such as a wet etch or a reactive ion etch stripping process.

Trenches 26 may be used to form shallow trench isolation regions within semiconductor layer 10. Isolation regions may be field oxide regions, which may serve to isolate separate active regions on semiconductor layer 10 from one another. Although FIG. 5 illustrates the formation of three trenches across the illustrated portion of semiconductor layer 10, any number of trenches may be formed across the semiconductor layer in accordance with design specifications of the device. In addition, the scale of trenches 26 in relation to the other portion of the semiconductor topography is greatly exaggerated to emphasize the planarity of the topography as a result of a subsequent polishing process as shown in the embodiments of FIGS. 7a–7d. In general, the lateral dimensions of such trenches may be on the order of thousands of angstroms or a few microns. The lateral dimension of the topography shown in FIGS. 3–7d, on the other hand, may be several centimeters. As such, semiconductor layer 10 may include several trenches within the region extending from the edge of the semiconductor topography. In addition, various widths and depths of the trenches may be formed in accordance with the design specifications of the device.

Figure 6:
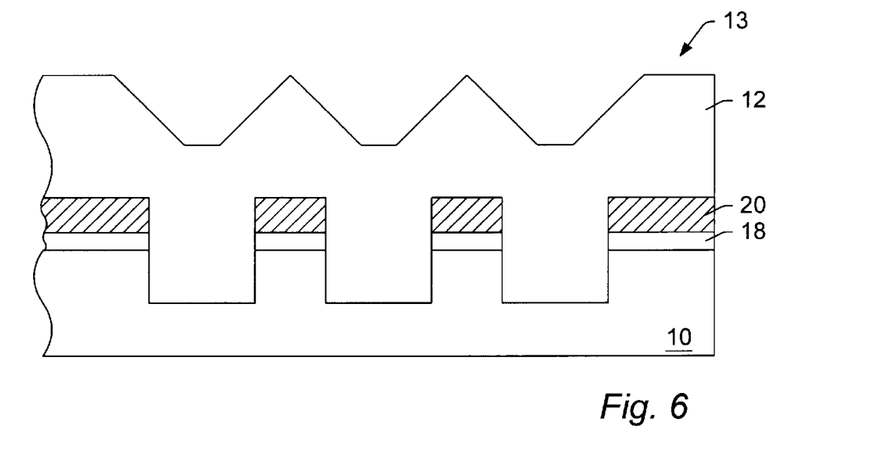
FIG. 6 depicts a partial cross-sectional view of a semiconductor topography in which an upper layer is formed within the trenches and above the polish stop layer subsequent to the trench formation of FIG. 5.

FIG. 6 illustrates filling trenches 26 with upper layer 12. Upper layer 12 may also be formed upon an upper surface of polish stop layer 20, which may be formed adjacent to trenches 26. Generally, upper layer 12 may be deposited conformally and thus, may have a non-planar upper surface as shown in FIG. 6. Alternatively, upper layer 12 may be relatively planar if the underlying structures and layers are substantially planar before the deposition of upper layer 12. The planarity of the upper layer may be defined by the thickness variation of the upper layer across the entirety of the semiconductor topography with respect to an underlying plane within the topography. On the other hand, the planarity of the upper layer may be determined by measuring an average thickness of the layer in one region of the semiconductor topography as compared to the average thickness of the layer in another region of the semiconductor topography. The thickness of upper layer 12 may be between approximately 3,000 angstroms and approximately 10,000 angstroms. Larger or smaller thicknesses of upper layer 12, however, may be appropriate depending on the semiconductor device being formed. The structure of upper layer 12 upon semiconductor layer 10 may be referred to as semiconductor topography 13.

In an embodiment, upper layer 12 may include any of various layers used in semiconductor fabrication. For example, upper layer 12 may include a polymetal dielectric layer or an intermetal dielectric layer. For example, upper layer 12 may include silicon dioxide ($SiO_2$), tetraorthosilicate glass (TEOS), silicon nitride ($Si_xN_y$), silicon oxynitride ($SiO_xN_y(H_z)$), or silicon dioxide/silicon nitride/silicon dioxide (ONO). In addition, upper layer 12 may be silicon dioxide deposited by a CVD process, which may be nitrided in a subsequent processing step. Upper layer 12 may also be formed from a low-permittivity ("low-k") dielectric, generally known in the art as a dielectric having a dielectric constant of less than about 3.5. One low-k dielectric in current use, which is believed to make a conformal film, is fluorine-doped silicon dioxide. In another embodiment, upper layer 12 may be formed from a high-permittivity ("high-k") dielectric. Appropriate materials for a high-k gate dielectric include, but are not limited to, tantalum pentoxide ($Ta_2O_5$), barium titanate ($BaTiO_3$), and titanium oxide ($TiO_2$). Upper layer 12 may be undoped or may be doped to form, for example, low doped BPSG, low doped PSG, or FSG. Low doped BPSG may have a boron concentration of less than approximately 5% by weight. Low doped PSG may have a phosphorus concentration of less than approximately 6% by weight, and more preferably less than approximately 5% by weight.

Alternatively, upper layer 12 may include a conductive material, such as polysilicon, aluminum, copper, titanium, or a metal alloy. Furthermore, because copper diffuses readily through silicon and oxide, and undesirably alters the electrical properties of transistors formed in silicon, a liner may be deposited on the semiconductor layer before deposition of a copper layer. A liner may preferably be formed from a conductive material, which acts as a diffusion barrier to the overlying copper, and also adheres well to semiconductor layer 10. Materials typically used as a liner, which is often called a diffusion barrier and/or an adhesion layer, may include metal nitrides such as titanium nitride and tantalum nitride, and refractory alloys such as titanium-tungsten. A copper layer may be typically formed using two deposition steps. A thin "seed" layer may be deposited first, followed by a more rapid "fill" deposition. The seed layer may be deposited by sputtering, but other methods such as CVD may also be used. Electroplating is a currently preferred method of depositing a copper layer, but other techniques, including CVD, may be used as well.

FIGS. 7a–7d illustrate several profiles of semiconductor topography 13 subsequent to polishing processes used to polish upper layer 12. In order to illustrate that the area of a substantially planar surface polished by the system as described herein is larger than the area of a substantially planar surface polished by a system including a flat surface carrier plate, regions within semiconductor topography 13 have been delineated. In particular, an exclusion region may represent the region of the topography adjacent to the outer edge of the semiconductor topography, while a target yield region may include a region of the topography including the center of the topography and extending to the boundary between the exclusion region and target yield region. Alternatively, the exclusion region and target yield region may be situated in any location of the semiconductor topography.

The dimensional profiles of such exclusion and target yield regions may effectively characterize the capabilities of the polishing process used to polish the topography. For example, the target yield region may represent the area of the topography that is substantially planar subsequent to the polishing process. In particular, the target yield region may represent the area of the topography in which a specific target yield of semiconductor devices may be suitably fabricated (i.e., within dimensional specifications). Examples of such target yields may be, for example, approximately 85% or approximately 95%. The target yield region may extend across a larger area of the topography during the process as described herein than with a process that includes a flat surface carrier, as will be shown in FIGS. 7a–7d. In addition, the exclusion region may represent the area of the topography that may be excluded from the target yield goals of the polishing process. Such an area is typically not capable of producing semiconductor devices within a target yield. It is noted that the boundary between such exclusion and target yield regions may not be noticeable upon the semiconductor topography itself. Such a boundary, rather, is primarily used to illustrate the difference in planarity between the CMP process as described herein as compared to conventional processes.

Figure 7A:
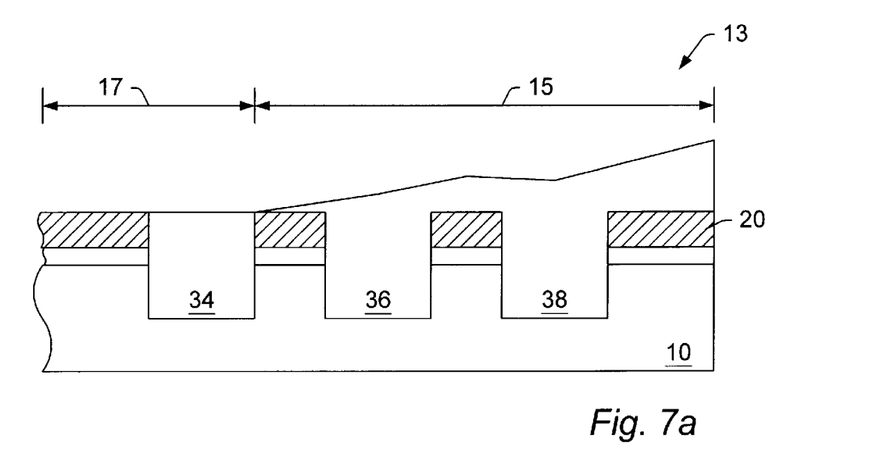
FIG. 7a depicts a partial cross-sectional view of a semiconductor topography in which the semiconductor topography of FIG. 6 is polished by a conventional CMP process to form a substantially planar upper surface.

FIG. 7a illustrates a profile of topography 13 subsequent to a conventional polishing process, i.e. a process which includes a flat surface carrier plate. In such an embodiment, the upper surface of topography 13 is substantially non-planar, particularly along the outer edge of the topography. More specifically, such a conventional polishing process typically polishes the topography in a manner that a region extending approximately 8 mm from the outer edge of the topography is substantially non-planar. The region of non-planarity may be designated as exclusion region 15 since semiconductor devices may not always be suitably fabricated in such an area of non-planarity. More specifically, a specific target yield, such as 85% or 95%, of semiconductor devices within dimensional specifications may not be obtained in such an area of non-planarity. Consequently, target yield region 17 may be designated as the region of the topography including the center of the topography and extending to a boundary approximately 8 mm from the outer edge of the topography. The boundary may be the interface between exclusion region 15 and target yield region 17. Such a process is undesirable since the area that is capable of producing a target yield of semiconductor devices within dimensional specifications (e.g., target yield region 17 of FIG. 7a) is at least confined to a region of the topography comprising the center of the topography and extending to approximately 8 mm from the outer edge of the topography.

Figure 7B:
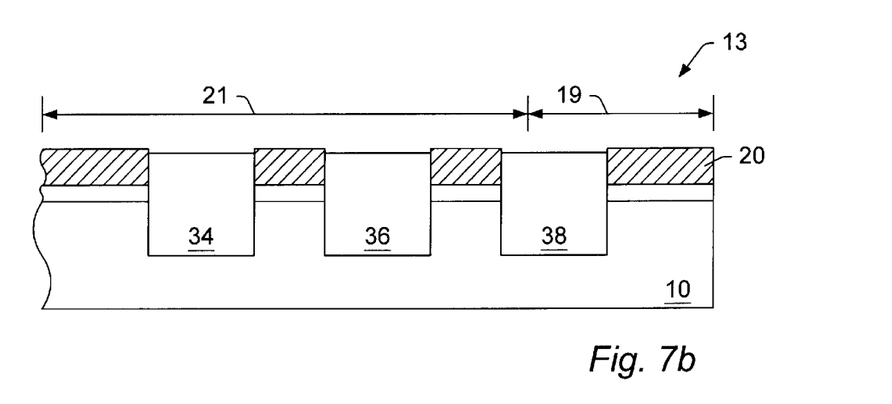
FIG. 7b depicts a partial cross-sectional view of a semiconductor topography in which the semiconductor topography of FIG. 6 is polished by a CMP process that includes a carrier plate with a raised section to form a substantially planar upper surface.
Figure 7C:
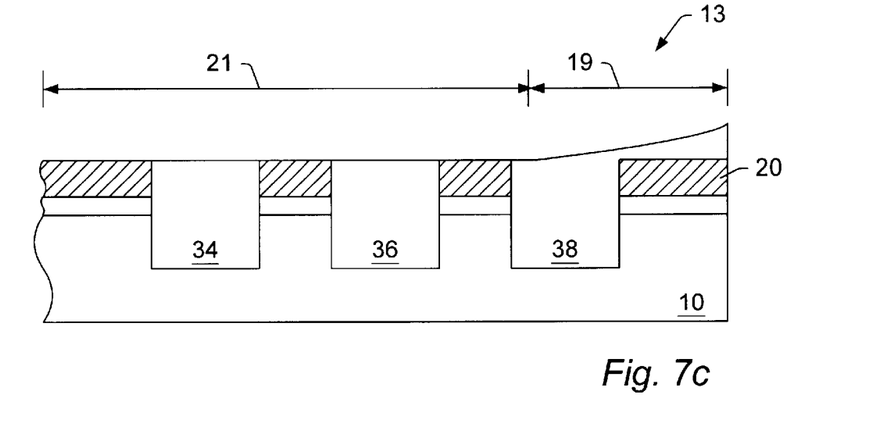
FIG. 7c depicts a partial cross-sectional view of a semiconductor topography, in an alternative embodiment, in which the semiconductor topography of FIG. 6 is polished by a CMP process that includes a carrier plate with a raised section to form a substantially planar upper surface.
Figure 7D:
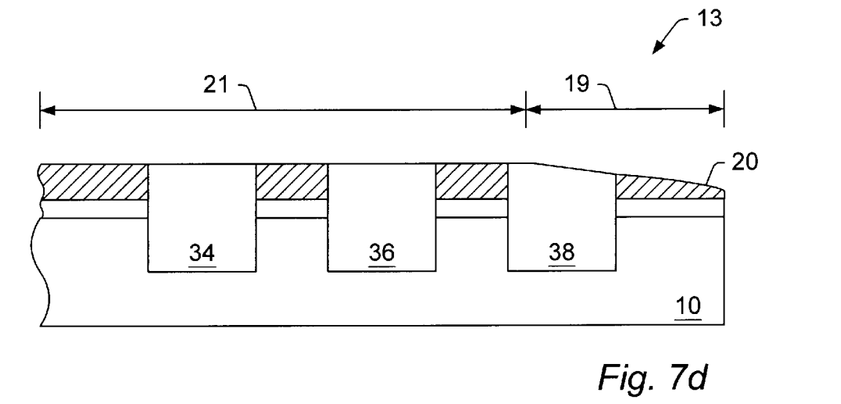
FIG. 7d depicts a partial cross-sectional view of a semiconductor topography, in an alternative embodiment, in which the semiconductor topography of FIG. 6 is polished by a CMP process that includes a carrier plate with a raised section to form a substantially planar upper surface.

FIGS. 7b–7d illustrate profiles of topography 13 subsequent to a planarizing step as described herein. Such a planarizing step forms a larger area capable of producing a target yield of semiconductor devices within dimensional specifications than is obtained with the polishing process used to form the topography illustrated in FIG. 7a. In particular, a larger target yield region is obtained in FIGS. 7b–7d than target yield region 17 obtained in FIG. 7a. As such, a smaller exclusion region may be obtained. For example, exclusion region 19 of FIGS. 7b–7d may extend inward from the outer edge of the topography by approximately 4 mm or less. More specifically, exclusion region 19 may extend from the outer edge of the topography by an amount between approximately 2 mm and approximately 4 mm. In this manner, target yield region 21 may include the center of the topography and extend to the boundary that is approximately 4 mm or less from the outer edge of the topography.

Different elevational profiles may be obtained using the system and method described herein as shown in FIGS. 7b–7d. For example, FIG. 7b illustrates a substantially planar upper surface of polished topography 13 subsequent to the planarizing step as described herein. In such an embodiment, a substantially planar surface is obtained within target yield region 21 and exclusion region 19. Alternatively, topography 13 may look similar to that of FIG. 7c subsequent to the planarizing step of the presently claimed case. In such an embodiment, a substantially planar surface may be formed within target yield region 21. However, exclusion region 19 may include a slight excess of upper layer 12 upon the upper surface of topography 13. Such an excess of the upper layer is preferably approximately 4 mm or less from the outer edge of the topography. In yet another embodiment, topography 13 may look similar to that of FIG. 7d subsequent to the planarization step as described herein. In such an embodiment, the planarization process may form a substantially planar upper surface in target yield region 21. However, exclusion region 19, in such an embodiment, may be polished to a level below the upper surface of target yield region 21.

The elevational profile variations of FIGS. 7b–7d may be contributed to by a variety of parameters of the polishing process. For example, the surface materials being polished may greatly influence the planarity of the topography along the outer edge of the topography, particularly in exclusion region 19. More specifically, the hardness characteristics and elevational profile of the surface materials may affect the ability to planarize the topography, particularly in exclusion region 19. In addition, the rotational and lateral movement of the polishing pad relative to the semiconductor topography may affect the planarity of the topography. Additional factors, which may affect polish characteristics of the CMP process, may include elements such as the polishing tool, the pad materials, the slurry, and interactions between these elements.

The planarizing step of FIGS. 7b–7d may include placing semiconductor topography 13 of FIG. 6 against a carrier plate with a carrier backing film interposed between at least a portion of the backside of the topography and the plate. The backing film may include the configuration presented in FIG. 1a. In addition, the carrier plate may include any of the configurations discussed in FIG. 1a. As such, semiconductor topography 13 may be positioned against a carrier plate with a raised section. Preferably, semiconductor topography 13 is positioned against the surface of the carrier plate with the raised section. In other words, the carrier plate is preferably arranged such that the raised section is facing the polishing pad.

The inclusion of such a carrier plate may compensate for the upper layer non-uniformity that is usually formed with conventional polishing processes. Consequently, a substantially planar surface may be formed across a larger area of the polished topography than a substantially planar surface formed by positioning the topography against a carrier plate with a flat surface. In addition, the planarizing process may be conducted in a single step. Other polishing methods and systems are not believed to produce a substantially planar surface across such large areas of the topography in a single polishing step. Consequently, the method described in FIGS. 3–7d may include depositing one or more additional layers upon planarized topography 13 such that additional layers or structures (e.g., interlevel dielectrics layers, conductive vias, and interconnect lines) may be formed.

Figure 8:
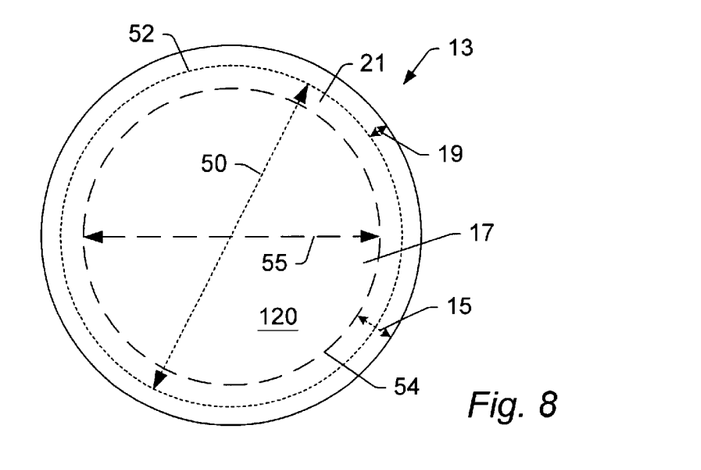
FIG. 8 depicts a top view of a polished topography.

The differences between the large area formed by the system as described of the presently claimed case as compared to an area formed by a conventional process is illustrated in FIG. 8. In particular, the top view of polished topography 13 formed by a CMP process with a carrier plate having a raised section is illustrated. Target yield region 21 includes a region of polished topography 13 (illustrated by diameter arrow 50) including the center of the topography and extending to boundary 52, which is the interface between target yield region 21 and exclusion region 19. In a preferred embodiment, boundary 52 may be less than approximately 4 mm from the outer edge of the topography. In some embodiments, boundary 52 may be approximately 2 mm or less from the outer edge of the topography. As shown in FIG. 8, boundary 52 may run in alignment with the entire outer edge of the topography. In this manner, target yield region 21 may be centered upon the semiconductor topography.

For illustrative purposes, the topography formed by conventional CMP processes in FIG. 7a is superimposed into the top view of FIG. 8. In particular, a topography which may be formed by a CMP process which includes a flat surface carrier plate is shown relative to a topography formed by the system as described herein. The superimposition of the two topographies is shown for illustrative purposes only and is not to be interpreted as an illustration of a single polished topography. Target yield region 17 (illustrated by diameter arrow 55) may include the center of the topography extending to boundary 54, which is the interface between target yield region 17 and exclusion region 15. Typically, boundary 54 extends at least approximately 8 mm from the outer edge of the topography. As shown in FIG. 8, target yield region 21 is considerably larger than target yield region 17. In particular, target yield region 21 (illustrated by diameter arrow 50) may include the center of the topography extending to boundary 52, which is the interface between target yield region 21 and exclusion region 19. In some embodiments, boundary 52 may extend from the outer edge of the topography by approximately 4 mm or less. Consequently, more of the semiconductor topography in target yield region 21 may be used for the fabrication of functional semiconductor devices. As such, production throughput may be increased with the use of a carrier plate having a raised section during CMP processing as described herein.

Referring back to FIGS. 7b–7d, the planarizing process may further include exposing an upper surface of polish stop layer 20. As such, other structures and layers may be elevationally adjacent to polish stop layer 20 subsequent to the planarizing process. In this manner, the upper surface of the topography subsequent to planarizing may be of substantially uniform elevation. In FIGS. 6 and 7b–7d, upper layer 12 may be formed within trenches 26 (from FIG. 5) to form, for example, shallow isolation regions 34, 36, and 38. Thus, the polished upper surface of upper layer 12 within the isolation trenches may be coplanar with an upper surface of polish stop layer 20 formed adjacent to isolation regions 34, 36, and 38. Alternatively, the planarizing process may include planarizing the upper surface of the upper layer to a level spaced above or below the polish stop layer. In either embodiment, the thickness of a structure arranged at boundary 52 of target yield region 21 may differ by less than approximately 10% from a thickness of a corresponding structure arranged within the center of the topography. In another embodiment, the thickness of a structure arranged at boundary 52 of target yield region 21 may differ by less than approximately 5% from a thickness of a corresponding structure arranged in the center of the topography. In some cases, the planarizing process may include etching a portion of polish stop layer 20. As such, the thickness of polish stop layer 20 may be reduced along with a portion of upper layer 12. In either case, a semiconductor device may be arranged at boundary 52 of target yield region 21 since the upper surface of the topography at such a location is substantially planar.

Although FIGS. 7b–7d illustrate the formation of three isolation regions across the illustrated portion of semiconductor layer 10, any number of isolation regions may be formed across the semiconductor layer in accordance with design specifications of the device. In addition, the scale of isolation regions 34, 36, and 38 in relation to the other portions of the semiconductor topography is greatly exaggerated to emphasize the planarity of the topography as a result of the method as described herein. In general, the lateral dimensions of such trenches may be on the order of thousands of angstroms or a few microns. The lateral dimensions of target yield region 21 and exclusion region 19, on the other hand, may be several millimeters. As such, semiconductor layer 10 may include several isolation regions at or around boundary 52 of target yield region 21. In addition, various widths and depths of the isolation regions may be formed in accordance with the design specifications of the device.

The use of a carrier plate with a raised section during a CMP process may facilitate a substantially constant polishing rate across a larger area of the semiconductor topography than with the use of a carrier plate with a flat surface. Preferably, the polishing rate differential across the portion of the topography polished to form the larger area is less than approximately 10%. Furthermore, the polishing rate differential across the portion of the topography polished to form the larger area may be less than approximately 5%. The polishing rate variation across the topography may vary, however, depending on the design specifications of the wafer fabrication process. In particular, the polishing rates of the method as described herein may be optimized such that a substantially planar upper surface of the semiconductor topography may be obtained. For example, the polishing rate of upper layer 12 in a region near the center of the topography may be between approximately 2500 angstroms/minute and approximately 2900 angstroms/minute. Likewise, the polishing rate of upper layer 12 at or near subsequently formed boundary 52 may be between approximately 2500 angstroms/minute and approximately 2900 angstroms/minute.

Figure 9:
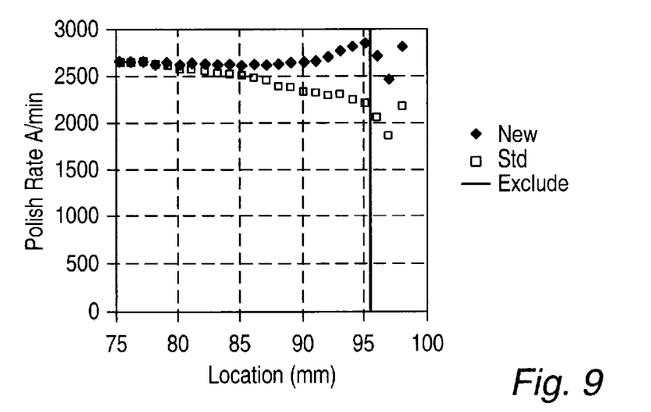
FIG. 9 depicts a graph comparing the polishing rates of a CMP process that includes a flat surface carrier plate and a CMP process that includes a carrier plate with a raised section.

A graph comparing the polishing rates of oxide in an exemplary embodiment of the method as described herein with an embodiment of the standard method of using a flat surface carrier is illustrated in FIG. 9. In particular, the polishing rate of oxide with the method including a carrier plate with a raised section illustrated in FIG. 9 varies from approximately 2600 angstroms/minute to approximately 2800 angstroms/minute across the topography excluding the region extending approximately 4 mm from the outer edge. In contrast, the polishing rate of oxide using the standard method illustrated in FIG. 9 varies from approximately 2250 angstroms/minute to approximately 2700 angstroms/minute, yielding nearly a 20% variation. The polishing rates of each process were calculated by comparing pre-polish and post-polish thickness measurements.

As shown in FIG. 9, the polishing rate of the topography at the boundary (extending approximately 4 mm from the outer edge of the topography) of the subsequently formed larger area may be greater than or equal to the polishing rate at the center of the topography. In some cases, the polishing rate of the topography at the boundary of the subsequently formed larger area may be greater than the polishing rate at the center of the topography. In an alternative embodiment, the polishing rate of the topography at the boundary of the subsequently formed larger area may be less than the polishing rate at the center of the topography. As stated above, the polishing rate variation across such a large area is preferably less than 10%.

In an embodiment in which the unpolished topography is substantially planar before the CMP process (e.g., an embodiment in which upper layer 12 is formed over a substantially planar surface), an amount of the semiconductor topography removed during the planarizing process may vary by less than approximately 10% across the portion of the topography planarized to form the larger area of the presently claimed case. Moreover, the amount of the semiconductor topography removed during the planarizing process may vary by less than approximately 5% across the portion of the topography planarized to form the larger area.

Figure 10:
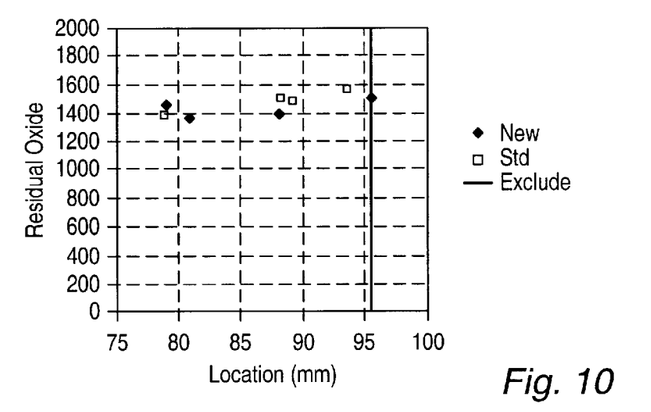
FIG. 10 depicts a graph comparing the amount of oxide that resides upon an upper surface of a semiconductor topography after polishing the topography with a CMP process that includes a flat surface carrier plate and a CMP process that includes a carrier plate with a raised section.

The planarization process alternatively may be described in terms of the amount of the polished layer that may remain on the upper surface of the polished topography. For example, the thickness variation of the upper layer across the larger area of the topography as formed by the method as described herein may be less than approximately 10%. Moreover, the thickness variation of the upper layer across such a larger area may be less than approximately 5%. A comparison of the amount of residual oxide left upon the topography of an exemplary embodiment using the system as described herein and a conventional system is illustrated in FIG. 10. The graph shows that the residual thickness of an upper layer polished by a process as described herein varies between approximately 1400 angstroms and 1500 angstroms, yielding less than a 10% variation. On the contrary, however, the standard process which uses a flat-surface carrier plate illustrates a residual thickness between approximately 1400 angstroms and 1750 angstroms, which yields over a 20% variation in residual thickness.

Figure 11:
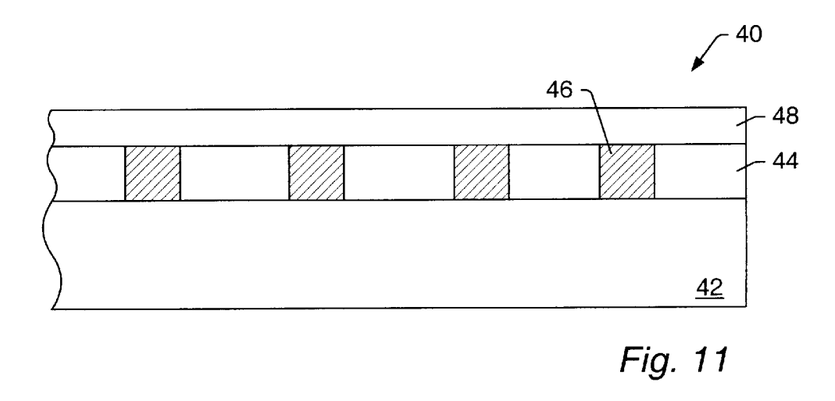
FIG. 11 depicts a partial cross-sectional view of a semiconductor topography, in an alternative embodiment, in which a polished upper layer is arranged upon conductive structures interposed within a dielectric layer, wherein the conductive structures and dielectric layer are arranged upon a device layer.

FIG. 11 illustrates another exemplary embodiment of a semiconductor topography planarized using the method as described herein. In particular, FIG. 11 depicts semiconductor topography 40, which includes conductive structures 46 arranged within dielectric 44 arranged upon device layer 42. Moreover, upper layer 48 may be arranged upon conductive structures 46 and dielectric 44. Device layer 42 may include structures and layers formed upon a semiconductor substrate, such as a monocrystalline silicon semiconductor substrate. The structures and layers may include, but are not limited to, gate dielectric layers, gate structures, contact structures, local interconnect wires, additional dielectric layers, or metallization layers. Diffusion regions (not shown) may also be formed in device layer 42. For example, diffusion regions may be lightly doped drain regions and heavily doped source/drain regions formed in the semiconductor substrate adjacent to gate structures. Furthermore, the semiconductor topography may include shallow trench isolation regions formed within a semiconductor substrate or within a layer formed upon a substrate. Alternatively, device layer 42 may include may be a silicon substrate. More specifically, device layer 42 may be an epitaxial silicon layer grown on a monocrystalline silicon substrate.

Conductive structures 46 may include gate structures, contact structures, local interconnect wires, or metallization layers. As such, dielectric 44 may include an interlevel dielectric. In addition, upper layer 48 may include an interlevel dielectric or a passivation layer. In some embodiments, upper layer 48 may be of the same material as dielectric 44. Alternatively, the upper layer 48 and dielectric 44 may include different materials. The planarized surface of layer 48 as shown in FIG. 11 may be substantially planar. In this manner, the thickness of upper layer 48 may be approximately uniform across the entirety of semiconductor topography 40. As with the polishing process of FIGS. 7b–7d, the planarizing process used to polish upper layer 48 is preferably adapted to form a larger area capable of producing a target yield of semiconductor devices within dimensional specifications than may be formed by a conventional system, i.e. a system with a flat surface carrier plate. As such, the thickness variation of upper layer 48 across the larger area of semiconductor topography 40 may be less than approximately 10%. Moreover, the thickness variation of upper layer 48 across the larger area of semiconductor topography 40 may be less than approximately 5%.

It will be appreciated to those skilled in the art having the benefit of this disclosure that this invention is believed to provide a method and a CMP system for processing a semiconductor topography. Further modifications and alternative embodiments of various aspects of the invention will be apparent to those skilled in the art in view of this description. For example, the methods described herein could be applied not just to planarizing a layer formed upon a semiconductor layer, but to planarizing any semiconductor feature or layer which may include planarizing a region of the topography in a single polishing step. Moreover, the methods and systems described herein may be used for any type of polishing applications, including polishing systems not used in the semiconductor industry. In addition, the method and devices described herein may be adapted for wafers of any size (e.g., 6 inch, 8 inch, or 12 inch diameter wafers). Furthermore, the larger area of the semiconductor topography obtained by the method as described herein may vary with wafer size. It is intended that the following claims be interpreted to embrace all such modifications and changes and, accordingly, the drawings and the specification are to be regarded in an illustrative rather than a restrictive sense.

What is claimed is:

1. A method for polishing a semiconductor topography, comprising:

positioning the topography against a carrier plate with a raised section; and polishing the topography such that an area including the center of the topography and extending to a boundary approximately 4 mm or less from the outer edge of the topography is capable of producing a target yield of semiconductor devices within dimensional specifications greater than or equal to approximately 85%.

2. The method of claim 1, wherein said polishing comprises forming a substantially planar surface across the area in a single polishing step.

3. The method of claim 1, wherein said boundary is approximately 2 mm or less from the outer edge of the polished topography.

4. The method of claim 1, wherein said topography subsequent to said polishing comprises a plurality of structures, and wherein a thickness of a structure arranged at the boundary differs by less than approximately 10% from a thickness of a corresponding structure arranged near the center of the topography.

5. The method of claim 1, wherein a polishing rate of the topography at the boundary is greater than or equal to a polishing rate at the center of the topography.

6. The method of claim 1, wherein a polishing rate differential across the area including the center of the topography and extending to the boundary is less than approximately 10%.

7. The method of claim 6, wherein the polishing rate differential across the area including the center of the topography and extending to the boundary is less than approximately 5%.

8. The method of claim 1, wherein said target yield is greater than 95%.

9. The method of claim 1, wherein the step of polishing comprises polishing the topography such that the outer edge region slopes upwardly from the substantially planar surface of the central region.

10. The method of claim 1, wherein the step of polishing comprises polishing the topography such that the outer edge region slopes downwardly from the substantially planar surface of the central region.

11. A method for processing a semiconductor topography, comprising:
- positioning the topography against a polishing system carrier place comprising a raised section; and
- polishing the topography in a single step such that:
  - a central region of the topography extending to a boundary approximately 4 mm or less from the outer edge of the topography is substantially planar; and
  - an outer edge region of the topography slopes from the substantially planar surface of the central region.

12. The method of claim 11, further comprising depositing an additional layer upon the polished topography.

13. The method of claim 11, wherein said positioning comprises positioning the topography against the surface of the carrier plate including the raised section.

14. The method of claim 11, wherein said raised section comprises a lip arranged at the edge of the carrier plate.

15. The method of claim 11, wherein an amount of the semiconductor topography removed during said polishing varies by less than approximately 10% across the central region.

16. The method of claim 11, wherein the amount of the semiconductor topography removed during said polishing varies by less than approximately 5% across the central region.

17. A polishing system comprising a carrier plate with a raised section adapted to planarize a semiconductor topography in a single polishing step, wherein the raised section is less than approximately 0.005 inches thick.

18. The system of claim 17, wherein the thickness variation of the raised section is less than or equal to approximately 0.0005 inches.

19. The system of claim 17 wherein the thickness variation of the raised section is more than approximately 0.0005 inches.

20. The system of claim 17, wherein the cross-sectional lateral dimension of the raised section is between approximately 1 mm and approximately 10 mm.

21. The system of claim 20, wherein the cross-sectional lateral dimension of the raised section between approximately 2 mm and approximately 4 mm.

22. The system of claim 17, wherein said carrier plate further comprises multiple raised sections adapted to planarize the semiconductor topography in the single polishing step.

* * * * *

UNITED STATES PATENT AND TRADEMARK OFFICE
CERTIFICATE OF CORRECTION

PATENT NO. : 6,761,619 B1  Page 1 of 1
DATED : July 13, 2004
INVENTOR(S) : Held

It is certified that error appears in the above-identified patent and that said Letters Patent is hereby corrected as shown below:

Title page,
Item [74], *Attorney, Agent, or Firm*, please delete "Mollie E. Lellang" and substitute therefor -- Mollie E. Lettang --.

Signed and Sealed this

Second Day of November, 2004

JON W. DUDAS
*Director of the United States Patent and Trademark Office*